US 6,664,483 B2

(12) United States Patent
Chong et al.

(10) Patent No.: US 6,664,483 B2
(45) Date of Patent: Dec. 16, 2003

(54) ELECTRONIC PACKAGE WITH HIGH DENSITY INTERCONNECT AND ASSOCIATED METHODS

(75) Inventors: Tee Onn Chong, Penang (MY); Seng Hooi Ong, Penang (MY); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/858,238

(22) Filed: May 15, 2001

(65) Prior Publication Data

US 2002/0172026 A1 Nov. 21, 2002

(51) Int. Cl.[7] .................................................. H05K 7/06
(52) U.S. Cl. ...................... 174/261; 361/777; 257/786
(58) Field of Search .............................. 361/772–774, 361/777, 778; 174/250, 260–262; 257/773, 775, 776, 786, 692; 349/149–152

(56) References Cited

U.S. PATENT DOCUMENTS

| | | | | |
|---|---|---|---|---|
| 3,967,162 A | * | 6/1976 | Ceresa et al. ................ | 361/751 |
| 4,495,377 A | | 1/1985 | Johnson et al. .............. | 361/777 |
| 4,643,526 A | * | 2/1987 | Watanabe et al. ............ | 349/151 |
| 6,150,729 A | * | 11/2000 | Ghahghahi .................... | 257/698 |
| 6,194,668 B1 | * | 2/2001 | Horiuchi et al. ............. | 174/261 |
| 6,229,099 B1 | * | 5/2001 | Horiuchi et al. ............. | 174/261 |
| 6,243,283 B1 | * | 6/2001 | Bertin et al. ........... | 365/230.03 |
| 6,271,478 B1 | * | 8/2001 | Horiuchi et al. ............. | 174/255 |
| 6,310,398 B1 | | 10/2001 | Katz .......................... | 257/773 |
| 6,313,522 B1 | * | 11/2001 | Akram et al. ................ | 257/686 |
| 6,327,695 B1 | * | 12/2001 | Bothra et al. .................. | 716/2 |
| 6,407,344 B1 | * | 6/2002 | Horiuchi et al. ............. | 174/261 |
| 6,448,634 B1 | * | 9/2002 | Hashimoto ................... | 257/668 |
| 6,479,758 B1 | * | 11/2002 | Arima et al. ................ | 174/260 |

FOREIGN PATENT DOCUMENTS

| | | | | |
|---|---|---|---|---|
| EP | 0883182 | 12/1998 | ......... | H01L/23/523 |
| EP | 0921567 | 6/1999 | ......... | H01L/23/498 |
| EP | 0928029 | 7/1999 | ......... | H01L/23/538 |
| EP | 1071316 | 1/2001 | ............ | H05K/1/18 |
| EP | 1075026 | 2/2001 | ......... | H01L/23/498 |

OTHER PUBLICATIONS

Dehkordi, P., et al., "Determination of Area–Array Bond Pitch for Optimum MCM Systems: A Case Study", *Proceedings of the IEEE Multi–Chip Module Conference*, Los Alamitos, (Feb. 4, 1997), 8–12.

Fjelstad, J., "Chip Scale Packages—Their Future Impact on PCB Design", *Electronic Engineering*, (Mar., 1998), 75–79.

* cited by examiner

Primary Examiner—John B. Vigushin
(74) Attorney, Agent, or Firm—Schwegman, Lundberg, Woessner & Kluth, P.A.

(57) ABSTRACT

An electronics package comprises an integrated circuit (IC) coupled to an IC substrate in a flip-chip ball grid array (FCBGA) configuration. The IC comprises a high density pattern of interconnect pads around its periphery for coupling to a corresponding pattern of bonding pads on the IC substrate. The substrate bonding pads are uniquely arranged to accommodate a high density of interconnect pads on the IC while taking into account various geometrical constraints on the substrate, such as bonding pad size, trace width, and trace spacing. In one embodiment, the substrate bonding pads are arranged in a zigzag pattern. In a further embodiment, the technique is used for bonding pads on a printed circuit board to which an IC package is coupled. Methods of fabrication, as well as application of the package to an electronic package, an electronic system, and a data processing system, are also described.

34 Claims, 12 Drawing Sheets

ELECTRONIC PACKAGE WITH HIGH DENSITY INTERCONNECT AND ASSOCIATED METHODS

TECHNICAL FIELD

Embodiments of the present invention relate generally to electronics packaging and, more particularly, to an electronic package that includes an integrated circuit die or an integrated circuit package coupled to a substrate with a high density interconnect, and to manufacturing methods related thereto.

BACKGROUND INFORMATION

Integrated circuits (ICs) are typically assembled into electronic packages by physically and electrically coupling them to a substrate made of organic or ceramic material. One or more IC packages can be physically and electrically coupled to a substrate such as a printed circuit board (PCB) or motherboard to form a higher level electronic package or "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs, where each new generation of packaging must provide increased performance while generally being smaller or more compact in size. As market forces drive equipment manufacturers to produce electronic systems with increased performance and decreased size, IC packaging accordingly also needs to support these requirements.

In addition, manufacturers of high-end IC's, such as processors, are experiencing increasing demand for IC packages that can accommodate a high number of terminals (also referred herein as "bumps", "pads", or "lands") on the IC. As high-end IC's contain an increasing amount of internal circuitry, they likewise have an increasing number of terminals that need to be coupled to corresponding terminals on the IC package substrate. Some ICs have a relatively large number of input/output (I/O) terminals, as well as a large number of power and ground terminals.

An IC package substrate generally comprises a number of metal layers selectively patterned to provide metal interconnect lines (referred to herein as "traces"), and at least one electronic component mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as ICs, of the system.

"Flip-chip technology, whether ball grid array (BGA) or pin grid array (PGA), is a widely known technique for coupling ICs to a substrate. In fabricating a FCBGA package, for example, the electrically conductive terminals or lands on the inverted "upper" surface of an IC component are soldered directly to corresponding lands of a die bond area on the surface of the substrate using reflowable solder bumps or balls.

In addition to using FCBGA technology to couple an individual IC die to a substrate, whether at the single IC package level or at a higher level such as a chip-on-board (COB) multi-chip module, it is also well known to use FCBGA to couple an IC package to a substrate such as a printed circuit board (PCB) or motherboard. Solder bumps, for example, can be employed between lands on the IC package and corresponding lands on the PCB.

As the internal circuitry of ICs, such as processors, increases in complexity and size, such IC's have increasingly higher density formations of bonding terminals or lands. Typically this is manifested in a high density formation of lands conducting input and/or output signals. In order for an IC having a dense formation of lands to be packaged on a substrate, the substrate needs to have a relatively high signal trace "escape density". That is, the substrate mush have an increasingly higher density of signals traces per unit length along the edge of the die bond area, or per unit area of the die bond area, that need to be connected to the lands of the IC or the IC package.

Thus, IC substrates need to provide mounting terminals that provide a higher signal trace escape density to accommodate the high density formations of lands on IC's. However, current dimension design rules for IC substrates serve to limit reductions in the width and spacing of traces on IC substrates. They also limit reductions in the size of terminals on IC substrates.

For the reasons stated above, and for other reasons stated below which will become apparent to those skilled in the art upon reading and understanding the present specification, there is a significant need in the art for apparatus and methods for packaging an IC or an IC package on a substrate that provide increased density of substrate terminal patterns, while still conforming to current dimension design rules for terminal size and for the width and spacing of substrate traces.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the disclosure may be practiced. These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

Embodiments of the present invention provide a solution to package density constraints in the form of dimension design rules that specify minimum sizes of terminals on IC substrates, as well as minimum width and spacing of traces on the substrate. Various embodiments are illustrated and described herein.

In one embodiment, an IC die having a dense formation of terminals or lands is mounted on a die mounting region of an IC package substrate. The die mounting region comprises a corresponding dense formation of terminals or lands that are arranged in a geometrical pattern that maximizes the density of the formation of such terminals, while being simultaneously constrained by the size of individual terminals and by the width and spacing of traces on the substrate that are coupled to the terminals.

In one embodiment, the terminals on the substrate are arranged in a zigzag pattern. In other embodiments, the terminals are arranged in a wave pattern, an undulating pattern, a vertical stack pattern, and in combinations of the aforementioned patterns.

In another embodiment, a packaged IC is mounted on a substrate, such as a printed circuit board (PCB) that has a dense formation of terminals as described above. Various methods of fabricating a package substrate and of packaging an IC on a substrate are also described.

By arranging the substrate terminals in the manner described herein, the performance and cost characteristics of high-density IC's can be maintained despite current design rule constraints that are applicable to certain connection features of substrates, such as the terminal size, trace width, and trace spacing. As a result, electronic packages and electronic systems, including data processing systems, utilizing such high-density IC packages can achieve superior performance, cost, quality, and marketing advantages in the commercial marketplace.

Figure 1:
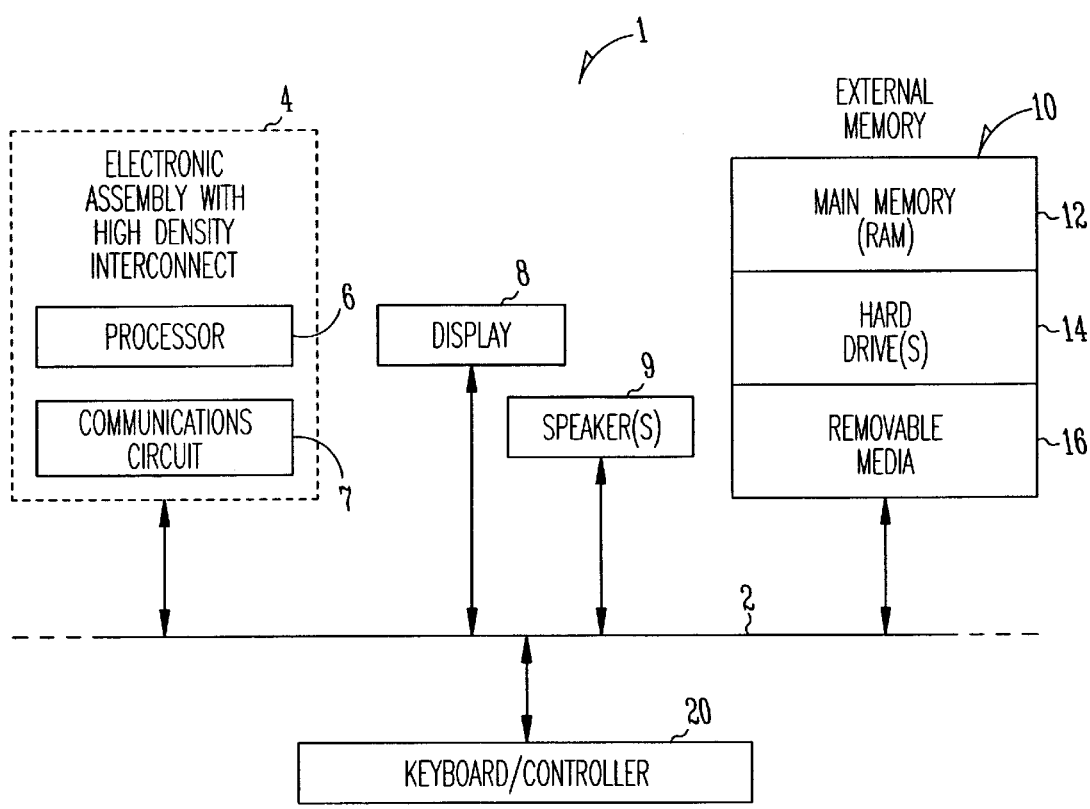
FIG. 1 is a block diagram of an electronic system incorporating at least one electronic package with a high density interconnect, in accordance with one embodiment of the invention.

FIG. 1 is a block diagram of an electronic system 1 incorporating at least one electronic assembly 4 with a high density interconnect, in accordance with one embodiment of the invention. The high density interconnect of embodiments of the present invention can be implemented at one or more different hierarchical levels, e.g. at the chip packaging level or at the PCB level.

Electronic system 1 is merely one example of an electronic system in which embodiments of the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, a speaker 9, and a keyboard and/or controller 20, which can include a mouse, trackball, game controller, voice-recognition device, or any other device that permits a system user to input information into and receive information from the electronic system 1.

Figure 2:
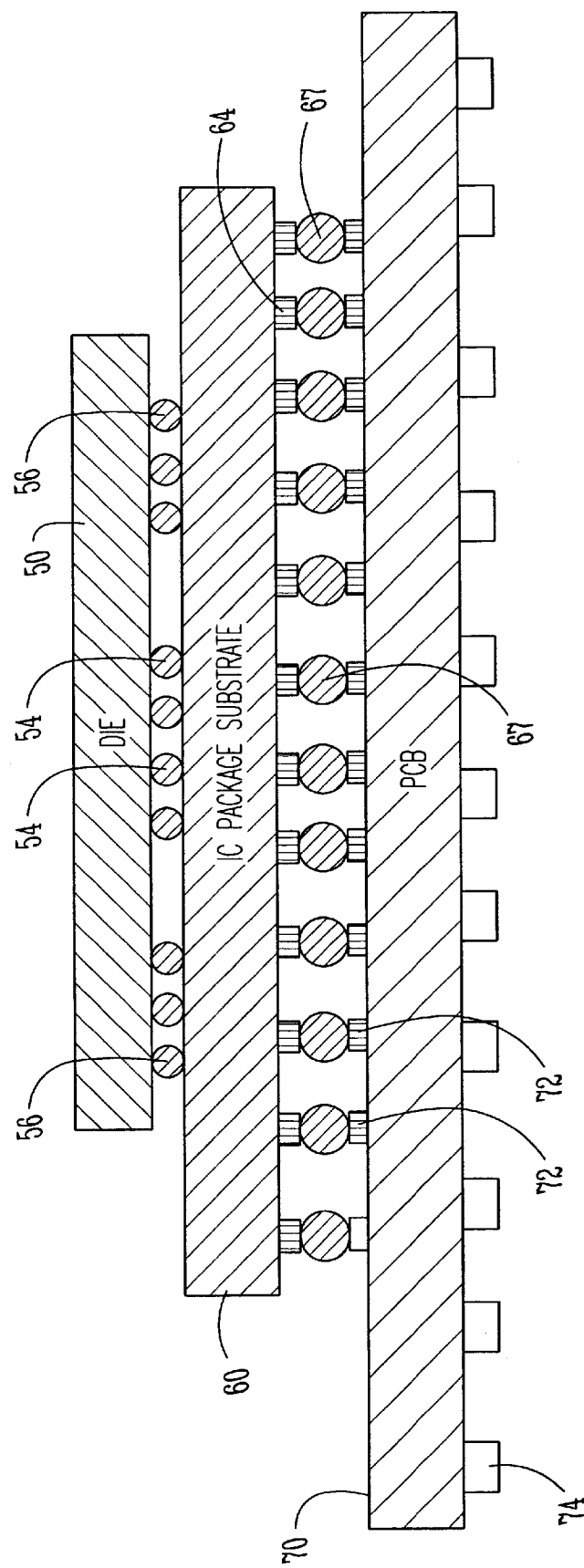
FIG. 2 illustrates a cross-sectional representation of a prior art electronic package comprising a die mounted on an IC package substrate, which in turn is mounted on a printed circuit board (PCB)

FIG. 2 illustrates a cross-sectional representation of a prior art electronic package comprising a die 50 mounted on an IC package substrate 60, which in turn is mounted on a printed circuit board (PCB) 70. Die 50 comprises a plurality of signal conductors (not shown) that terminate in terminals or lands arranged in several rows near the periphery of the bottom surface of die 50, as will be well understood by those of ordinary skill in the art. These lands can be coupled to corresponding lands or signal nodes (not shown) on substrate 60 by appropriate connections such as solder bumps or solder balls 56.

Die 50 also comprises a plurality of power and ground conductors (not shown) that terminate in lands within the central region of die 50. These lands can be coupled to corresponding lands (not shown) on substrate 60 by appropriate connections such as solder balls 54.

IC package substrate 60 has a plurality of signal and power supply lands (not shown) on its upper surface and a plurality of signal and power supply lands 64 on its lower surface. Lands 64 of IC package substrate 60 are coupled to corresponding lands 72 of PCB 70 through solder balls or bumps 67. PCB 70 can optionally have lands 74 on its lower surface for attachment to an additional substrate or other packaging structure.

Figure 3:
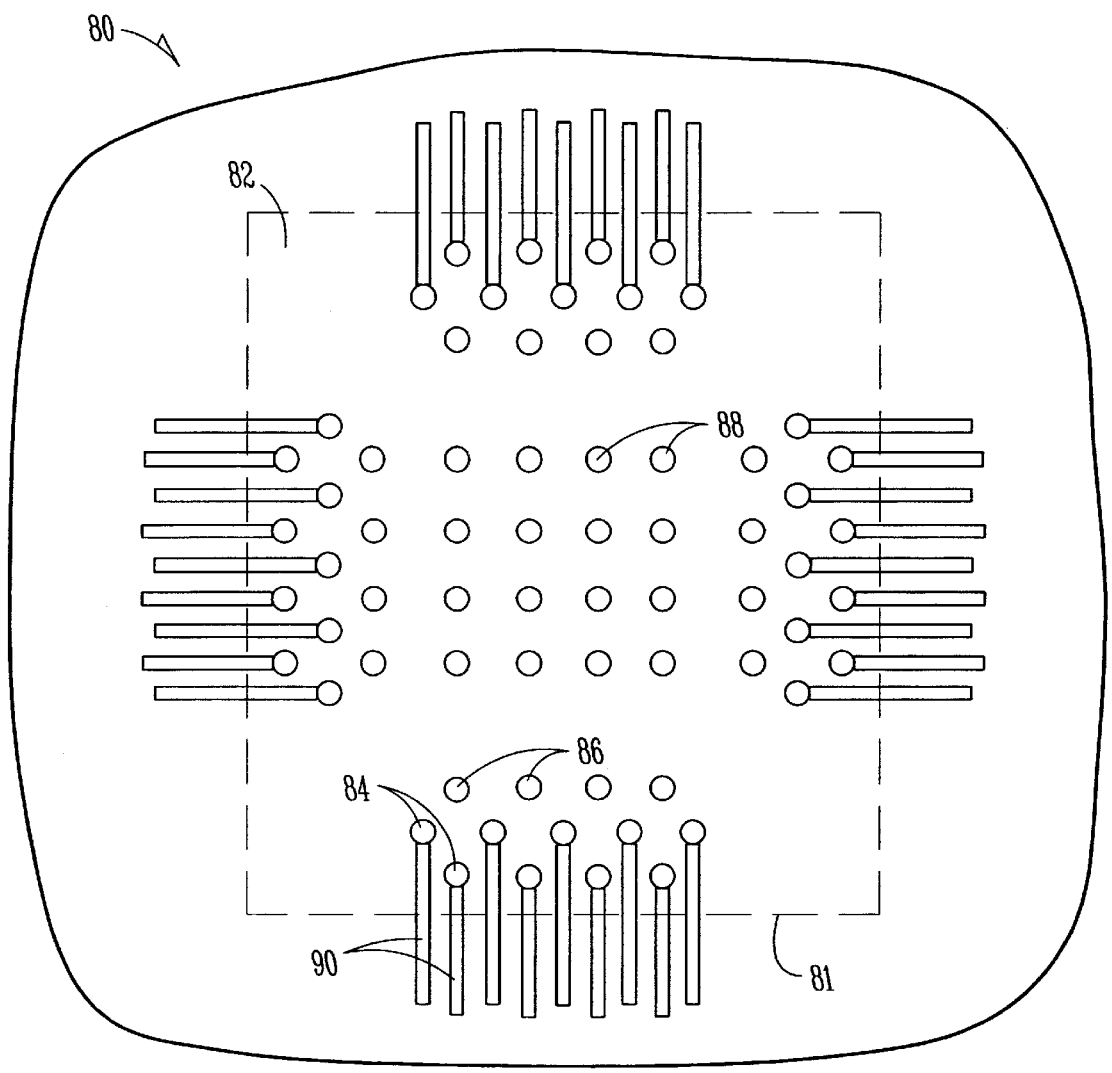
FIG. 3 illustrates a top view of a prior art die bonding area of a portion of an IC package substrate.

FIG. 3 illustrates a top view of a prior art die bonding area 82 of a portion 80 of an IC package substrate. Die bonding area 82 is bounded by the region inside dashed line 81.

Die bonding area 82 includes terminals or bumps 84, 86, and 88 to which corresponding bumps (not shown) of an IC die are to be soldered. Bumps 84 and 86 typically represent signal nodes, and bumps 88 typically represent power supply nodes. Bumps 84, 86, and 88 are illustrated as being circular or oval, but they can also be square or rectangular.

Bumps 84, located in the first and second rows of bumps from the periphery of die bonding area 82, are physically and electrically connected to traces 90 that run or "escape" off die bonding area 82 to connect with other traces within the substrate structure.

The pattern of bumps 84, 86, and 88 shown in FIG. 3 is referred to as "face center square" or "face center rectangular" (if elongated in one direction).

Current dimension design rules for IC substrates specify minimum dimensions for the size of bumps 84, 86, and 88; for the width of traces 90; for the spacing between adjacent traces 90; and for the spacing between a trace 90 and a bump (other than a bump to which a trace 90 is connected).

Bumps 86, located in the third row of bumps from the periphery of die bonding area 82, are connected to traces (not shown) in one or more subsequent layers beneath the layer of the portion of an IC substrate shown in FIG. 3. Bumps 86 can be connected to such traces by way of vias, for example, or other conductive elements that interconnect traces on one layer to traces on other layers.

It will be seen from FIG. 3 that the prior art face center square pattern of input signal bumps limits the escape density. Because bumps 84, 86, and 88 are formed in straight rows parallel to the edge 81 of die bonding area 82, the escape density (i.e. the spacing between adjacent traces 90 at edge 81) is constrained by the minimum width of the bumps between which the traces must pass, e.g. the row of bumps 84 that is closest to the edge 81.

Figure 4:
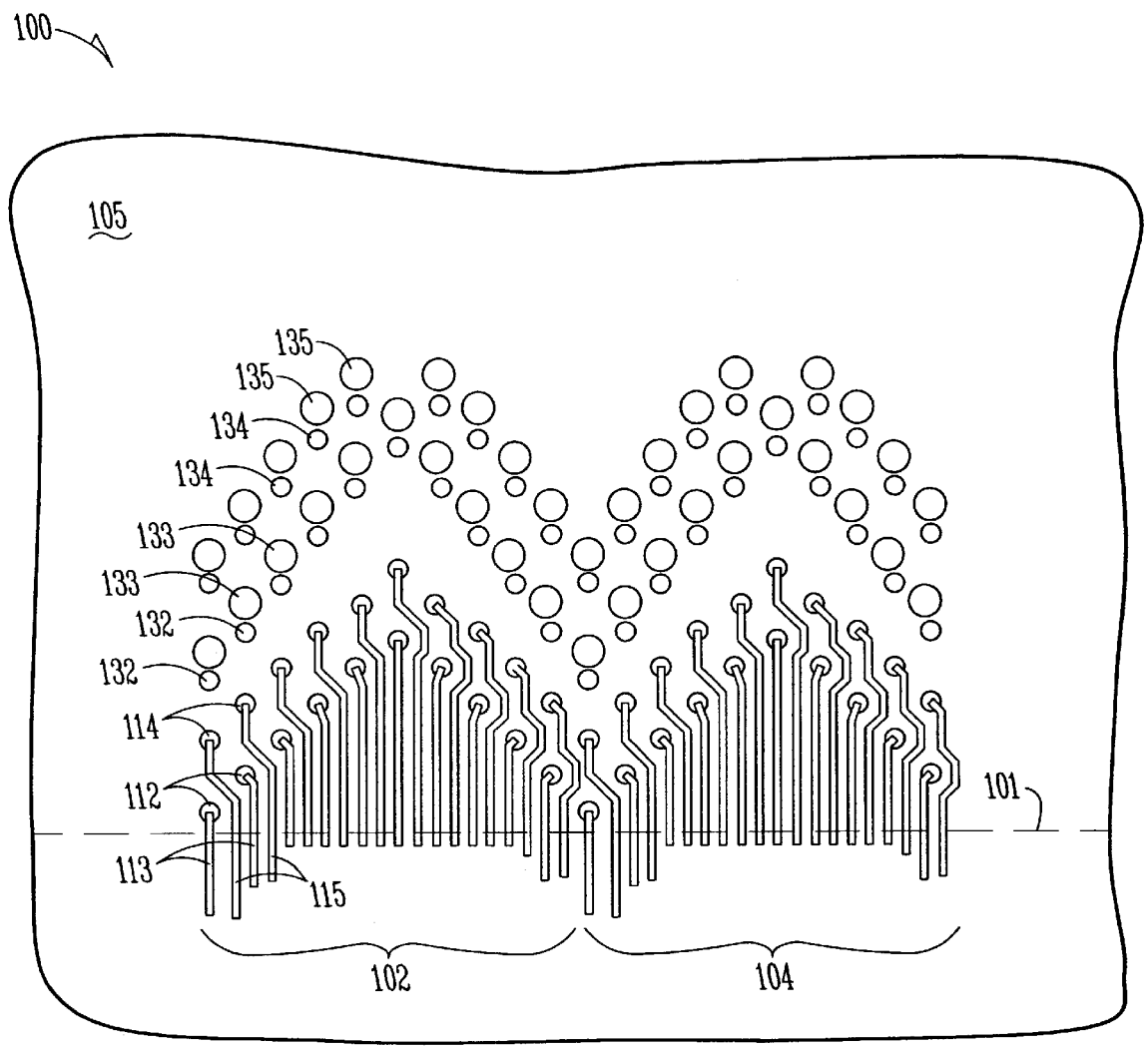
FIG. 4 illustrates a top view of a portion of a top layer of a die bonding area of an IC package substrate, in accordance with one embodiment of the invention.

FIG. 4 illustrates a top view of a portion 100 of a top layer of a die bonding area 105 of an IC package substrate, in accordance with one embodiment of the invention. In FIG. 4, the region above dashed line 101 lies inside the die bonding area 105, and the region below dashed line 101 lies outside the die bonding area 105. The substrate illustrated in FIG. 4 is a multi-layered substrate; however, embodiments of the invention can also be implemented on a single-layered substrate.

Two groups 102 and 104 of substantially identical trace patterns appear adjacent to one another. However, it will be understood that any side of die bonding area 105 could comprise more than two groups, particularly to bond a die having hundreds or thousands of bumps.

Each group 102 or 104 comprises a zigzag pattern of terminals or bumps 112, to which corresponding traces 113 are coupled. As shown in FIG. 4, each group 102 or 104 can also comprise an additional zigzag pattern of bumps 114 coupled to traces 115. The pattern of bumps 114 is substantially parallel to that of bumps 112.

It will be seen from FIG. 4 that the zigzag pattern of input signal bumps allows a much higher escape density than a face center rectangular pattern of bumps, as shown in FIG. 3. Because the bumps 112 and 114 of the embodiment illustrated in FIG. 4 are not formed in straight rows parallel to the edge 101 of die bonding area 105, the escape density (i.e. the spacing between adjacent traces 90 at edge 81) is no longer constrained by the minimum width of the bumps between which the traces must pass, e.g. the row of bumps 112 that is closest to the edge 101.

Because bumps 112 are formed in such a geometrical pattern that successive bumps 112 do not lie side-by-side in a line parallel to edge 101, traces 115 are able to pass between bumps 112 at or above the minimum distance from bumps 112 and, more significantly, traces 115 can escape edge 101 at a spacing that can be as small as the minimum pitch or distance between the corresponding edges of two consecutive traces (i.e. the trace width plus trace spacing), rather than at a spacing that is constrained by the width of signal bumps along edge 101. Thus the escape density can be significantly greater in the embodiment of FIG. 4 than in prior art packages, such as the prior art arrangement shown in FIG. 3. For similar reasons, the additional embodiments illustrated in FIGS. 5–8 also achieve a significant improvement in escape density over prior art packages.

Individual traces 113 and 115 are shaped in any suitable manner to pass from their respective bumps 112 or 114, respectively, to escape off the edge 101 of die bonding area 105. The implementation of embodiments of the invention is not limited to the particular shapes of individual traces 113 and 115 illustrated in the figures, such as FIG. 4

Each group 102 or 104 can additionally comprise additional zigzag patterns of bumps 132 and 134. The patterns of bumps 132 and 134 can be substantially parallel to those of bumps 112 and 114. Bumps 132 and 134 are for a subsequent layer of the substrate. Each of bumps 132 and 134 is electrically coupled to an associated via 133 or 135, respectively. Vias 133 and 135 can be micro vias, and they can be formed by any suitable technology such as laser drilling. Vias 133 and 135 go through the top layer of the substrate to couple with traces of one or more layers beneath the top layer. This is seen in FIG. 5, which will now be described.

Figure 5:
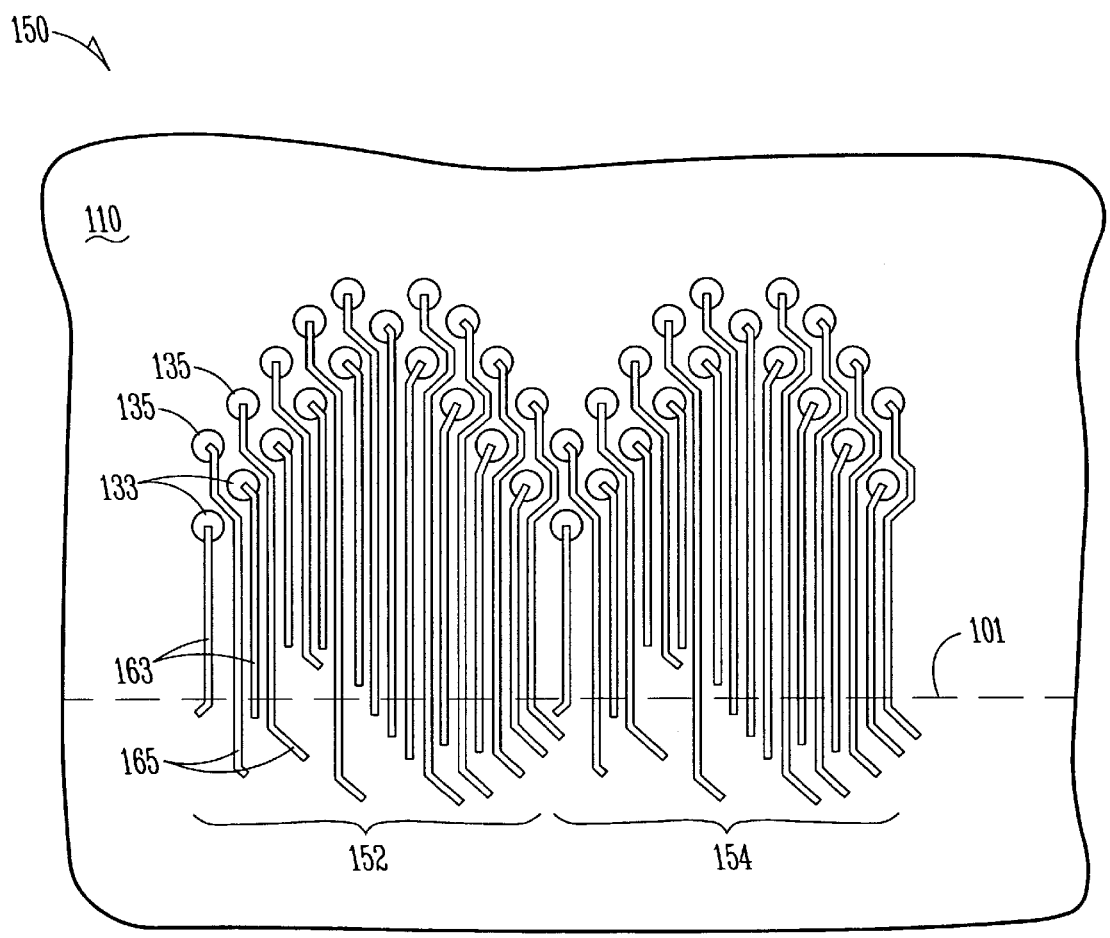
FIG. 5 illustrates a top view of a portion of a layer beneath a die bonding area of an IC package substrate, in accordance with the embodiment of the invention shown in FIG. 4.

FIG. 5 illustrates a top view of a portion 150 of a layer 110 beneath die bonding area 105 (FIG. 4) of an IC package substrate, in accordance with the embodiment shown in FIG. 4. In FIG. 5, the region above dashed line 101 lies inside and beneath die bonding area 105 (FIG. 4), and the region below dashed line 101 lies outside and beneath die bonding area 105 (FIG. 4).

Two groups 152 and 154 of substantially identical trace patterns appear adjacent to one another. However, it will be understood that more than two groups can be placed side-by-side, particularly to bond a die having hundreds or thousands of bumps.

Each group 152 or 154 comprises a zigzag pattern of vias 133, to which corresponding traces 163 are coupled. Each group 152 or 154 can also comprise an additional zigzag pattern of vias 135 coupled to traces 165. The pattern of vias 133 is substantially parallel to that of vias 135. Vias 133 and 135 are identical to the vias having the same reference numbers in FIG. 4. Vias 133 and 135 can either terminate in the layer illustrated in FIG. 5, or they can be coupled to traces or other circuit nodes in other layers.

Figure 6:
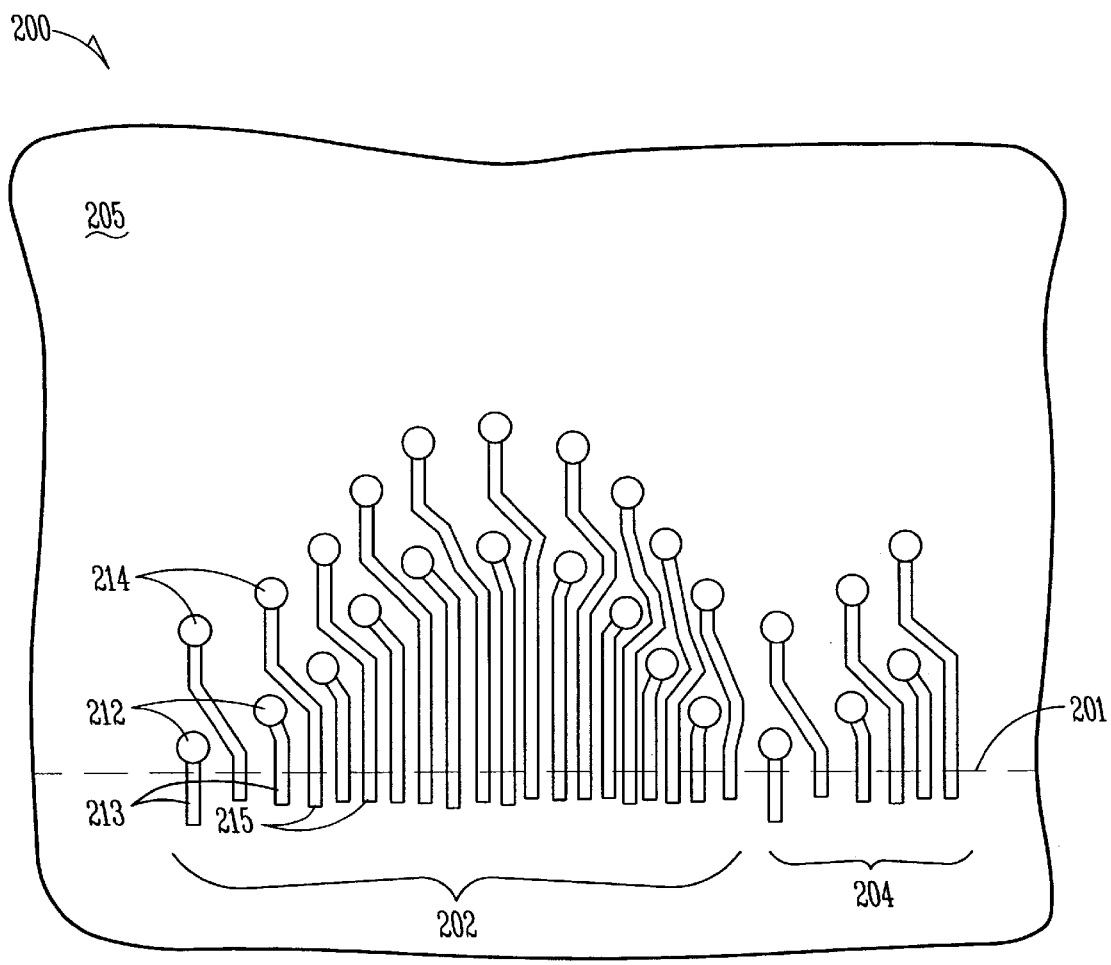
FIG. 6 illustrates a top view of a portion of a die bonding area of an IC package substrate, in accordance with an alternative embodiment of the invention.

FIG. 6 illustrates a top view of a portion 200 of a die bonding area 205 of an IC package substrate, in accordance with an alternative embodiment of the invention. In FIG. 6, the region above dashed line 201 lies inside die bonding area 205, and the region below dashed line 201 lies outside die bonding area 205.

Two groups 202 and 204 of substantially identical trace patterns appear adjacent to one another (only a portion of group 204 is shown). However, it will be understood that more than two groups can be placed side-by-side, particularly to bond a die having hundreds or thousands of bumps.

Each group 202 or 204 comprises an undulating pattern of bumps 212, to which corresponding traces 213 are coupled. Each group 202 or 204 can also comprise an additional undulating pattern of bumps 214 coupled to traces 215. The pattern of bumps 214 is substantially parallel to that of bumps 212.

Die bonding area 205 can comprise additional rows of undulating bumps (not shown) that can be coupled to one or more additional layers of IC substrate, similar to the embodiment shown in FIGS. 4 and 5.

Figure 7:
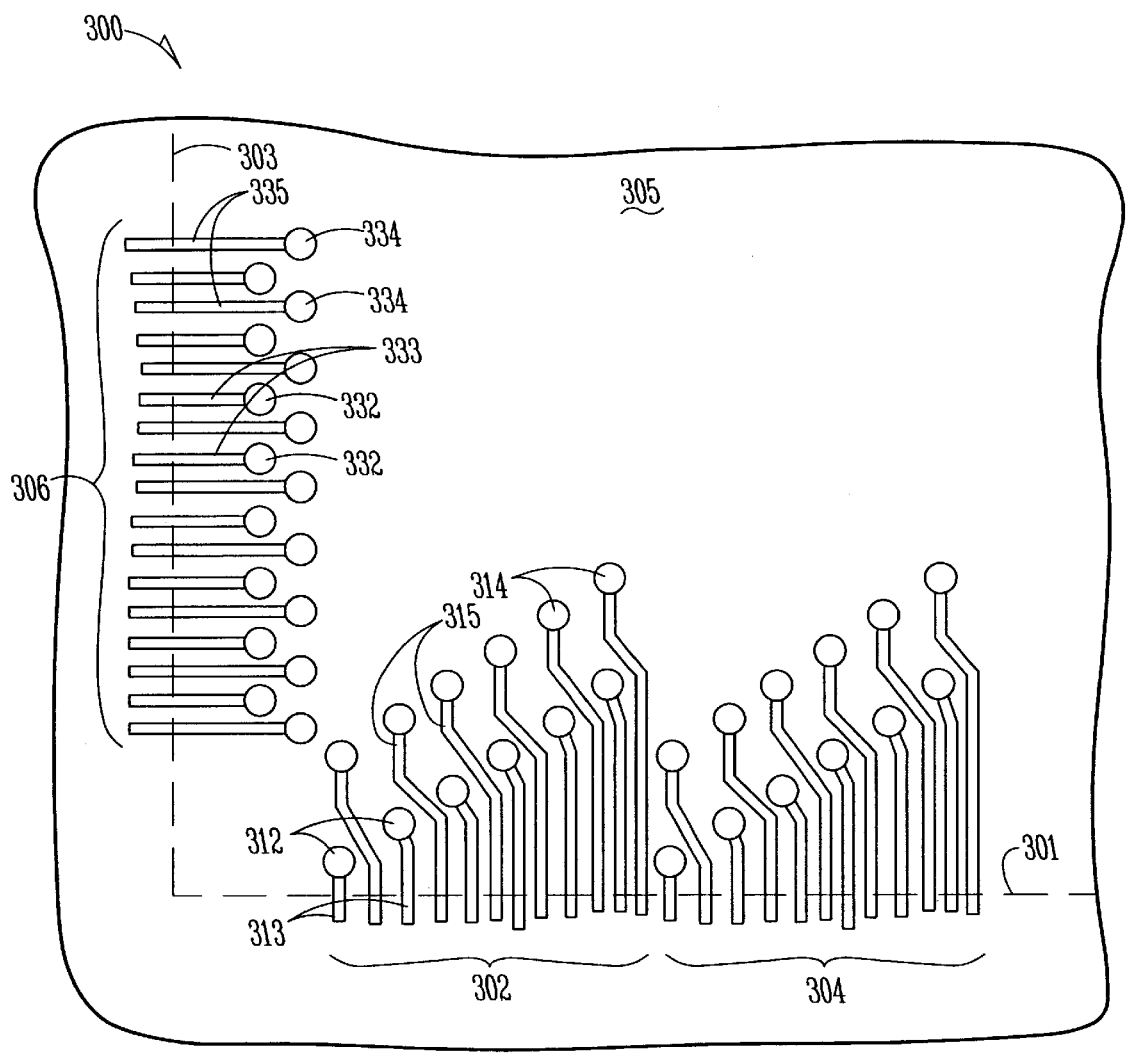
FIG. 7 illustrates a top view of a portion of a die bonding area of an IC package substrate, in accordance with an alternative embodiment of the invention.

FIG. 7 illustrates a top view of a portion 300 of a die bonding area 305 of an IC package substrate, in accordance with an alternative embodiment of the invention. In this embodiment, a combination of a face center rectangular pattern, represented by group 306, is combined with one or more wave patterns, represented by groups 302 and 304.

Face center rectangular pattern 306 comprises a row of bumps 332 inside edge 303, to which traces 333 are coupled. Face center rectangular pattern 306 further comprises a row of bumps 334, to which traces 335 are coupled.

Each wave pattern 302 or 304 comprises a wave pattern of bumps 312 inside edge 301, to which traces 313 are coupled. Each group 302 or 304 can further comprise an additional wave pattern of bumps 314 coupled to traces 315. The pattern of bumps 314 can be substantially parallel to that of bumps 312.

While wave patterns 302 and 304 are illustrated as a pair of repeating, asymmetric "sawtooth" like patterns, they could alternatively be formed as any number of and any combination of one or more patterns 302 or 304. Although wave patterns 302 and 304 are shown as having bump patterns that slope upward to the right, they could alternatively slope upward to the left in a mirror image or reversed pattern. Further, various combinations of bump patterns can be used that comprise both reversed and non-reversed wave patterns.

While the combination of two different bump patterns in FIG. 7 illustrates a combination of face center rectangular and wave patterns, many other combinations of bump patterns are possible, including any combination of the bump patterns illustrated herein. Further, although the embodiment of FIG. 7 provides a different bump pattern on two different sides of die bonding area 305, in other embodiments more than two different bump patterns could be used. Moreover, two or more bump patterns could also be used along the same edge of die bonding area.

Die bonding area 305 can comprise additional rows of face center rectangular and/or wave patterns (not shown) that can be coupled to one or more additional layers of IC substrate, similar to the embodiment shown in FIGS. 4 and 5.

Figure 8:
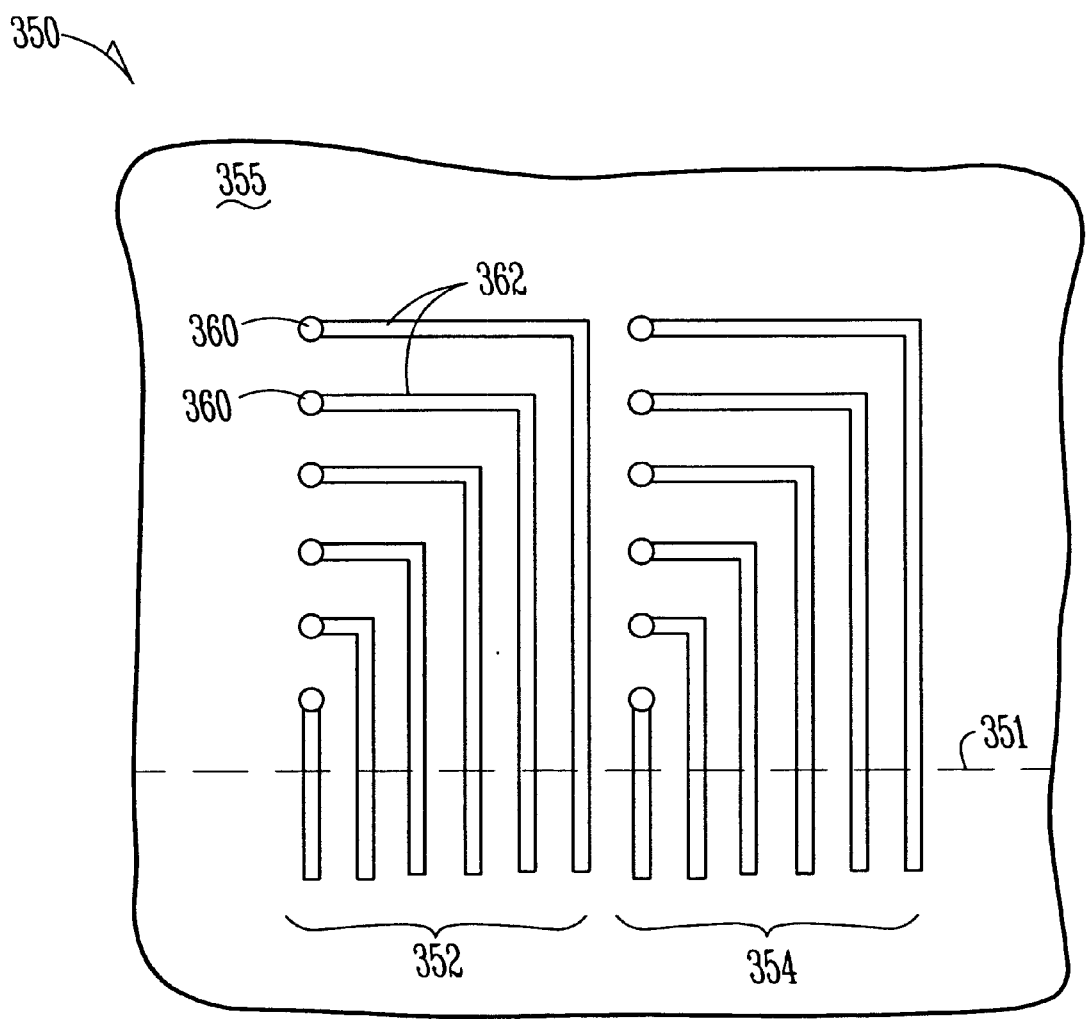
FIG. 8 illustrates a top view of a portion of a die bonding area of an IC package substrate, in accordance with an alternative embodiment of the invention.

FIG. 8 illustrates a top view of a portion 350 of a die bonding area 355 of an IC package substrate, in accordance with an alternative embodiment of the invention. In FIG. 8, the region above dashed line 351 lies inside die bonding area 355, and the region below dashed line 351 lies outside die bonding area 355.

Two groups 352 and 354 of substantially identical trace patterns appear adjacent to one another. However, it will be understood that more than two groups can be placed side-by-side, particularly to couple to a die having hundreds or thousands of bumps.

Each group 352 or 354 comprises a vertical stack pattern of bumps 360, to which corresponding traces 362 are coupled. While groups 352 and 354 illustrate vertical stack patterns of bumps 360 in which traces 362 are coupled to the right-hand side of bumps 360, traces 362 could alternatively be coupled to the left-hand side of bumps 360, in a mirror image or reversed pattern from that illustrated. Further, combinations of vertical stack patterns could be used having both reversed and non-reversed vertical stack patterns. Such combinations of reversed and non-reversed vertical stack patterns could be employed along one edge of die bonding area 355, or they could be provided on more than one edge of die bonding area 355.

Die bonding area 355 can comprise additional areas of vertical stack patterns (not shown) that can be coupled to one or more additional layers of IC substrate, similar to the embodiment shown in FIGS. 4 and 5.

While the embodiments illustrated in FIGS. 4–8 have been described in terms of IC dice coupled to IC substrates, embodiments of the invention are not limited to coupling an IC die to an IC substrate. They can be implemented in any electronics package in which it is desired to increase the escape density of traces. For example, the precepts of the invention can be applied to coupling an IC package to a substrate such as a PCB or motherboard, or to any other type of packaging element. Embodiments of invention can also be applied to coupling IC dice to land grid array (LGA), pin grid array (PGA), or chip scale package (CSP) substrates, or the like.

Figure 9:
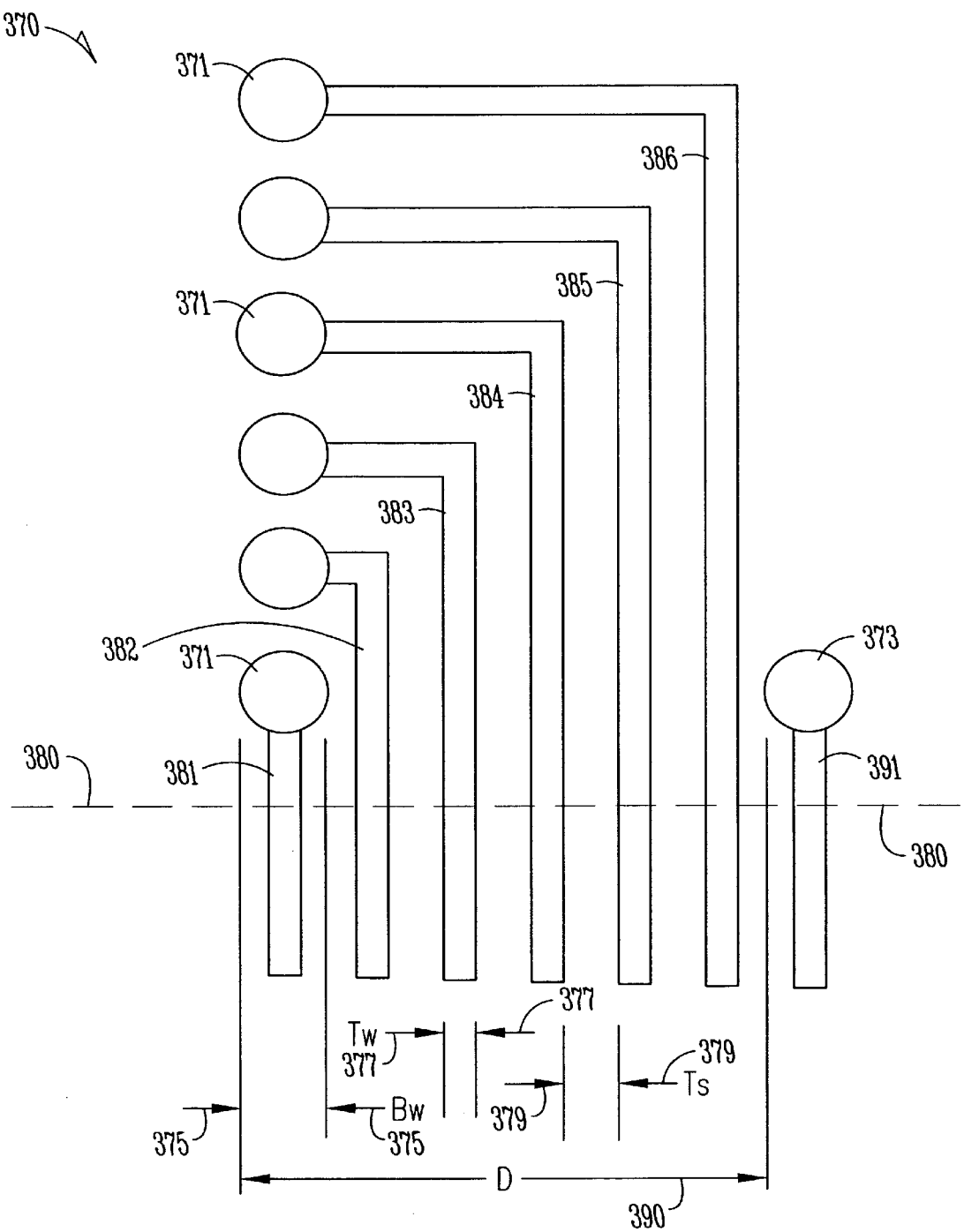
FIG. 9 illustrates a top view of a portion of a die bonding area of an IC package substrate, as used herein to define the maximum trace escape density of an idealized bump pattern.

FIG. 9 illustrates a top view of a portion 370 of a die bonding area of an IC package substrate, as used herein to define the maximum trace escape density of an idealized bump pattern. The bump pattern of FIG. 9 provides the highest density of trace escapes for arrangements wherein the escape density is primarily constrained by the bump pad dimension, because this bump pattern is constrained only by the trace width and trace spacing. Under current dimension design rules, the trace width and trace spacing are smaller than the bump pad dimension.

A first vertical stack pattern comprises bumps 371, which are vertically aligned. Each bump 371 is coupled to a respective trace 381–386. Traces 381–386 escape downward in this illustration off the lower edge (represented by dashed line 380) of the die bonding area. Only a portion of a second vertical stack pattern, comprising bump 373 and trace 391, is shown in FIG. 9

Equation (1) below defines the trace escape density TED (i.e. the number of trace escapes per unit distance) for a number N of traces in a particular trace pattern along a die edge for a single trace routing layer, given a particular bump width Bw, a minimum trace width Tw, and a minimum trace spacing Ts.

$$TED=N/[Bw*N+Tw*N+Ts*(N+1)]=N/D \quad\quad \text{Equation (1)}$$

The bump width Bw is the projection of a bump 371 upon the die edge, represented by the distance between the points of arrows 375. Tw is the trace width, represented by the distance between the points of arrows 377. Ts is the trace spacing, represented by the distance between the points of arrows 379. D is a given projection of a trace pattern upon a die edge, represented by the distance 390, which runs from the left-hand edge of a bump 371 in the trace pattern to the left-hand edge of a bump 373 in the adjacent trace pattern.

As mentioned earlier, the trace "pitch" is the distance between the corresponding edges of two consecutive traces (i.e. the trace width plus trace spacing), which equals Tw+Ts. The mathematical or geometrical limit of trace escape density occurs when the trace escape density (e.g. as measured per millimeter) equals the reciprocal of the pitch (e.g., given in microns). For example, if the pitch is 40 microns, the maximum trace escape density is $1/40\mu$ or 25 traces per millimeter.

A significant advantage of embodiments of the present invention is that any embodiment in which the effect of the bump pad dimension is minimized or is even eliminated enables the maximum trace escape density to be achieved. This can be accomplished with embodiments such as those illustrated in FIGS. 4–9.

Several methods for forming a substrate and/or packaging an integrated circuit will now be described.

Figure 10:
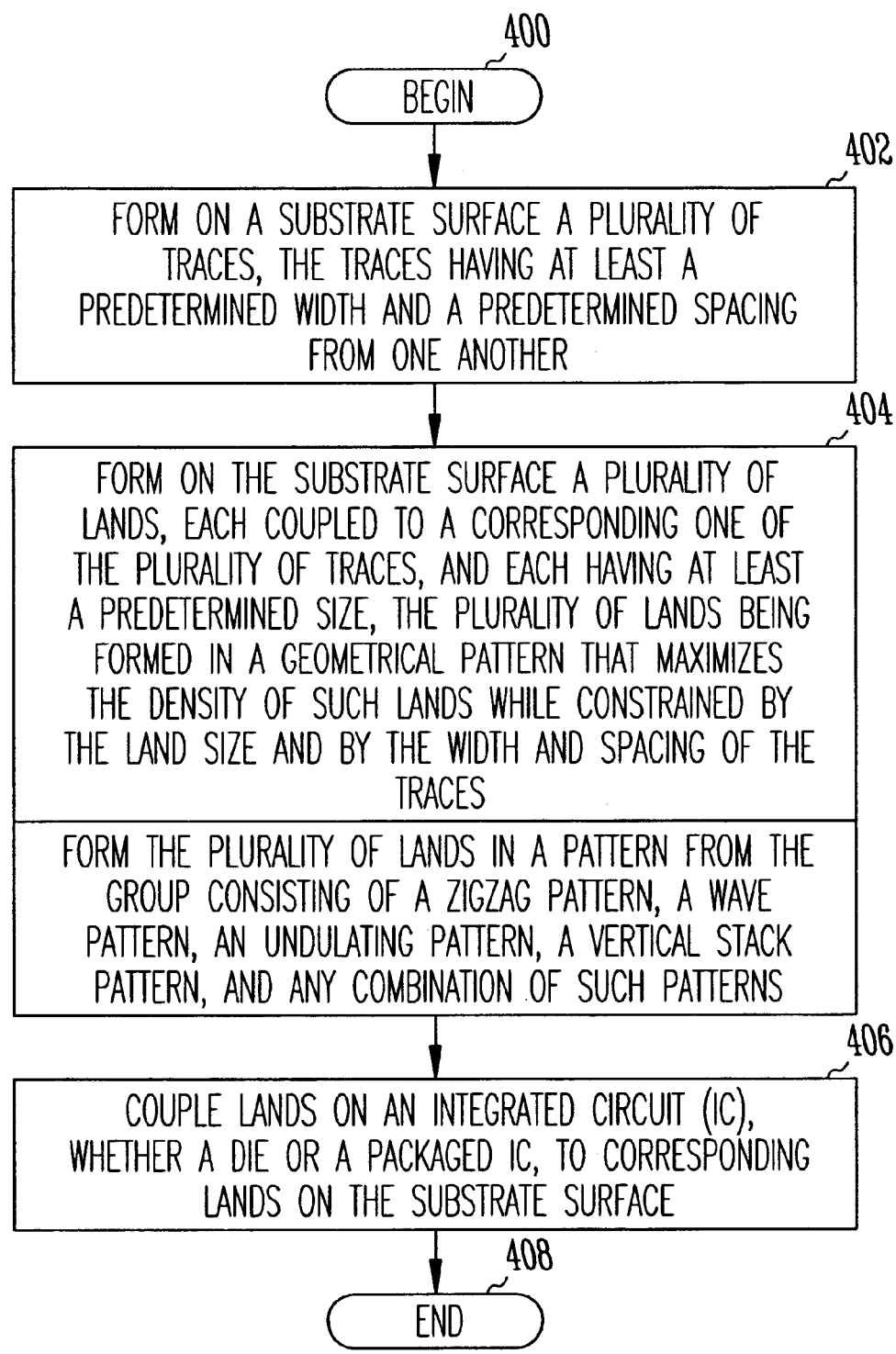
FIG. 10 is a flow diagram illustrating a method of forming a substrate and/or of packaging an IC die or an IC package on the substrate, in accordance with alternative embodiments of the invention.

FIG. 10 is a flow diagram illustrating a method of forming a substrate and, additionally if desired, of packaging an IC die or an IC package on the substrate, in accordance with alternative embodiments of the invention. The method begins at 400.

In 402, a plurality of traces are formed on a substrate surface. The traces have at least a predetermined width, and they have a predetermined spacing from one another.

In 404, a plurality of lands (also referred to herein as "terminals", "pads", "bumps", or "bump pads") are formed on the substrate surface. Each land is coupled to a corresponding one of the plurality of traces. Each land has at least a predetermined size (referring generally to the dimension of the land that is parallel to the edge of the die bonding area). The plurality of lands are formed in a geometrical pattern that maximizes the density of such lands while being subject to the constraints of the land size and to the width and spacing of the traces. The plurality of lands can be formed in a number of different patterns, such as a zigzag pattern, a wave pattern, an undulating pattern, a vertical stack pattern, and any combination of such patterns. Moreover, as mentioned earlier, any one or more of the above bump patterns can be combined with one or more other bump patterns with respect to any given die bonding area.

In 406 (optional embodiment), the lands of an IC are coupled to corresponding lands on the substrate surface using any suitable conductive material such as solder. The IC can be either an unpackaged die or a packaged IC. The method ends at 408.

Figure 11A:
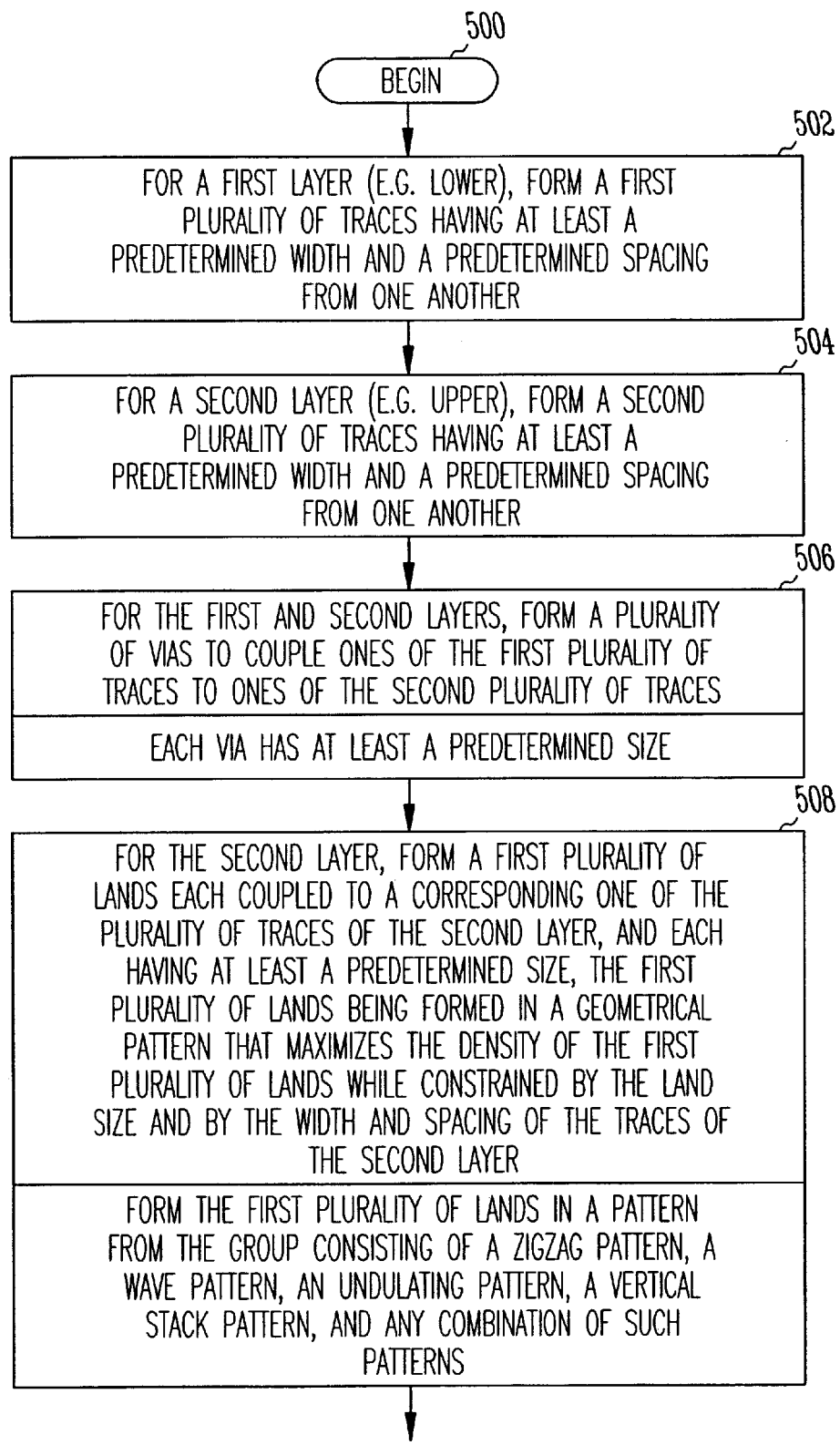
FIGS. 11A and 11B together constitute a flow diagram illustrating a method of forming a multi-layer substrate and/or of packaging an IC die or an IC package on the substrate, in accordance with alternative embodiments of the invention.
Figure 11B:
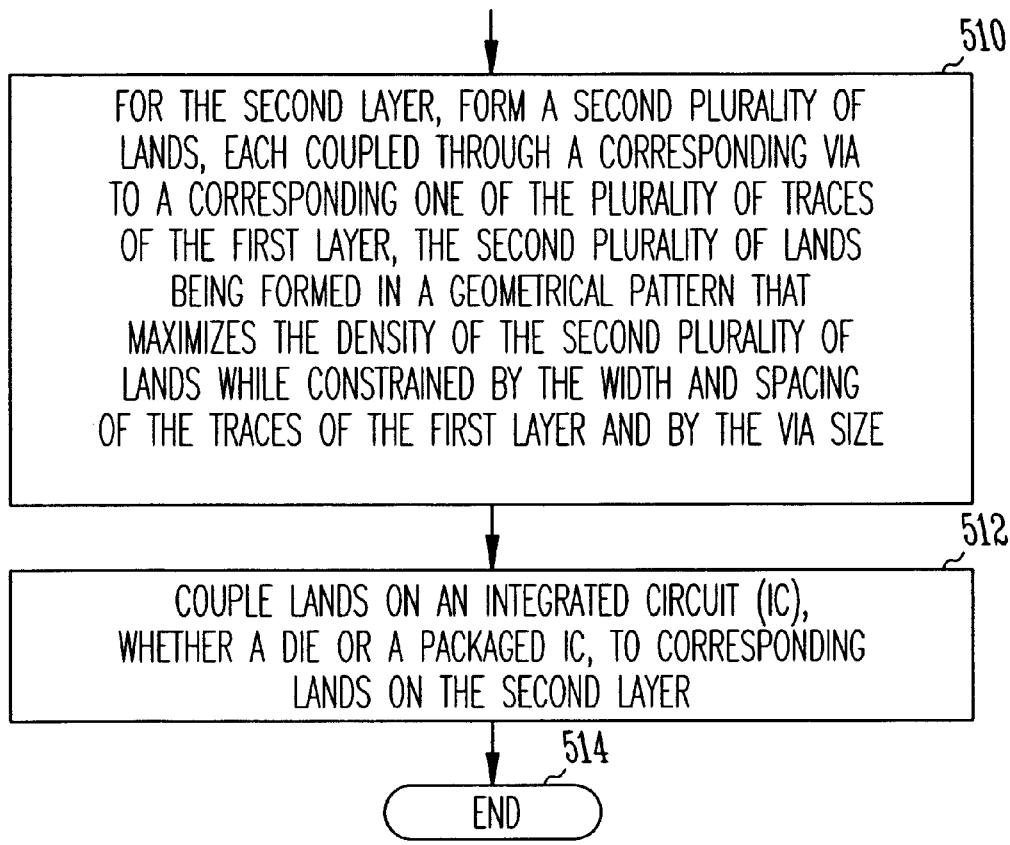

FIGS. 11A and 11B together constitute a flow diagram illustrating a method of forming a multi-layer substrate and, additionally if desired, of packaging an IC die or an IC package on the substrate, in accordance with alternative embodiments of the invention. The method begins at 500.

In 502, for a first layer of a multi-layer substrate (e.g. a lower layer), a first plurality of traces are formed. These traces have at least a predetermined width, and they also have a predetermined spacing from one another.

In 504, for a second layer of a multi-layer substrate (e.g. an upper layer), a second plurality of traces are formed. These traces have at least a predetermined width, and they also have a predetermined spacing from one another.

In 506, for the first and second layers, a plurality of vias are formed. The vias couple ones of the first plurality of traces to ones of the second plurality of traces. Each via has at least a predetermined size (referring generally to the dimension of the via that is parallel to the edge of the die bonding area).

In 508, for the second layer, a first plurality of lands is formed. Each of these lands is coupled to a corresponding one of the plurality of traces of the second layer. Each of these lands has a predetermined size. The first plurality of lands are formed in a geometrical pattern that maximizes the density of the first plurality of lands while being constrained by the land size, and by the width and spacing of the traces of the second layer. The first plurality of lands can be formed in a number of different patterns, such as a zigzag pattern, a wave pattern, an undulating pattern, a vertical stack pattern, and any combination of such patterns. Moreover, as mentioned earlier, any one or more of the above bump patterns can be combined with one or more other bump patterns with respect to any given die bonding area.

In 510, for the second layer, a second plurality of lands are formed. Each of these lands is coupled through a corresponding via to a corresponding one of the plurality of traces of the first layer. The second plurality of lands are formed in a geometrical pattern that maximizes the density of the second plurality of lands, while being constrained by the width and spacing of the traces of the first layer, as well as by the via size.

In 512 (optional embodiment), the lands of an IC are coupled to corresponding lands on the second layer of the substrate. The IC can be either a packaged or an unpackaged die. The method ends at 514.

The operations described above with respect to the methods illustrated in FIGS. 10, 11A, and 11B can be performed in a different order from those described herein. Also, it should be understood that although "End" blocks are shown for these methods, they may be continuously performed.

Conclusion

The present disclosure provides for an electronic package with high density interconnect, in several different embodiments, and for methods of manufacture thereof, that maximize trace escape density. Embodiments have been disclosed in which the trace density can reach the geometrical limit of the reciprocal of the pitch. An IC package and/or PCB that incorporates the high density interconnect features of the present disclosure has reduced physical dimensions and is capable of performing with enhanced electronic performance, and such systems are therefore more commercially attractive. Further, embodiments of the present invention minimize the growth of IC die size solely to provide adequate trace escape density on substrates. Embodiments of the present invention also reduce the need to provide substrates having additional layers to accommodate IC's having high densities of interconnect terminals, thus reducing design and manufacturing costs.

As shown herein, the present disclosure can be implemented in a number of different embodiments, including an electronic package substrate, an electronic package, an electronic system, a data processing system, methods for forming a package substrate, and methods for packaging an IC on a substrate. Other embodiments will be readily apparent to those of ordinary skill in the art. The elements, materials, geometries, dimensions, and sequence of operations can all be varied to suit particular packaging requirements.

For example, while an embodiment of an IC is shown in which signal traces are provided around the periphery and in which power supply traces are provided at the die core, embodiments of the invention are equally applicable to embodiments where signal traces and power supply traces are provided anywhere on the die. Moreover, embodiments of the invention are applicable to improving escape density for traces performing any type of function, and they are not limited to improving escape density for traces conducting input/output signals.

Further, embodiments of the present invention are not to be construed as limited to use in ball grid array (BGA)

packages, and they can be used with any other type of IC packaging technology where the herein-described features of the present invention provide an advantage, e.g. pin grid array (PGA), land grid array (LGA), chip scale package (CSP), or the like.

The expression "die bonding area" as used herein is meant to include an area of a higher level package, such as a PCB, to which an electronics package, such as a packaged IC, can be coupled, in addition to defining an area of an IC substrate to which an unpackaged IC die can be coupled.

Embodiments of present invention are not to be construed as limited to any particular type of substrate or to any particular method of coupling an IC or IC package to a substrate.

The shape or cross-section of individual bumps and vias can assume any geometrical form, such as squares, rectangles, circles, pentagons, hexagons, and so forth, and they could also assume any type of irregular geometric shape. Embodiments of present invention can be used with trace patterns wherein the trace width is less than, equal to, or greater than the trace spacing.

The terms "upper" and "lower" are to be understood as relative terms, and it should be understood that the scope of the disclosure includes corresponding elements in structures that may be inverted relative to those shown in the figures and described herein.

The above-described choice of materials, geometry, and assembly operations can all be varied by one of ordinary skill in the art to optimize the performance of the electronic package. The particular implementation of embodiments of the invention is very flexible in terms of the orientation, size, number, and composition of its constituent elements. Various embodiments of the invention can be implemented using any one or more of various geometrical arrangements of substrate terminals or lands to achieve the advantages of the present disclosure.

FIGS. 1 through 8 are merely representational and are not drawn to scale. Certain proportions thereof may be exaggerated, while others may be minimized. FIGS. 1 and 4–11 are intended to illustrate various implementations of the disclosure that can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present disclosure. Therefore, it is manifestly intended that embodiments of this invention be limited only by the claims and the equivalents thereof.

What is claimed is:

1. A substrate having a die-bonding area on which to mount an integrated circuit (IC) having a first dense formation of lands, the substrate comprising:
    a second dense formation of lands on a surface thereof and within the die-bonding area, each land having coupled thereto a substrate trace escaping the die-bonding area;
    wherein the second dense formation of lands is formed in an undulating pattern, wherein the maximum trace escape density equals the reciprocal of (Tw+Ts), and wherein Tw equals the width of the traces and Ts equals the spacing between the traces.

2. The substrate recited in claim 1, wherein the second dense formation of lands comprises a plurality of undulating rows at the periphery of the surface of the substrate.

3. The substrate recited in claim 1, wherein the second dense formation of lands further comprises a face center rectangular pattern.

4. A substrate having a die-bonding area on which to mount an integrated circuit (IC) having a first dense formation of lands, the substrate comprising:
    a second dense formation of lands on a surface thereof, each land having coupled thereto a corresponding substrate trace escaping the die-bonding area;
    wherein the second dense formation of lands is formed in a vertical stack pattern having at least one group of three or more lands in a vertical stack;
    wherein the substrate traces coupled to corresponding lands in a vertical stack are all located on the same side of the vertical stack; and
    wherein the maximum trace escape density equals the reciprocal of (Tw+Ts), and wherein Tw equals the width of the traces and Ts equals the spacing between the traces.

5. The substrate recited in claim 4, wherein the second dense formation of lands comprises a plurality of vertical stacks at the periphery of the surface of the substrate.

6. The substrate recited in claim 4, wherein the second dense formation of lands further comprises a face center rectangular pattern.

7. A method comprising:
    forming on a substrate surface a plurality of traces, the traces having at least a predetermined width and a predetermined spacing from one another; and
    forming within a die-bonding area on the substrate surface a plurality of lands, each coupled to a corresponding one of the plurality of traces, and each having at least a predetermined size, the plurality of traces escaping the die-bonding area, the plurality of lands being formed in at least one geometrical pattern that maximizes the trace escape density while constrained by the land size and by the width and spacing of the traces, wherein the at least one geometrical pattern comprises a vertical stack pattern having at least three or more lands in a vertical stack, wherein the maximum trace escape density equals the reciprocal of (Tw+Ts), and wherein Tw equals the width of the traces and Ts equals the spacing between the traces.

8. The method recited in claim 7, wherein the plurality of lands are formed as a plurality of vertical stack patterns at the periphery of the surface of the substrate.

9. The method recited in claim 8, wherein the plurality of vertical stack patterns each comprise at least three lands, and wherein the substrate traces coupled to corresponding lands in each vertical stack are all located on the same side of the vertical stack.

10. The method recited in claim 7, wherein the at least one geometrical pattern further comprises an undulating pattern.

11. The method recited in claim 7, wherein the at least one geometrical pattern further comprises a face center rectangular pattern.

12. A method comprising:
    forming lands within a die-bonding area on a substrate surface in a geometrical pattern to maximize the trace escape density of traces coupled to the lands and escaping the die-bonding area on the substrate surface while constrained by the land size and by the width and spacing of the traces, wherein the lands are formed in a vertical stack pattern having at least three or more lands in a vertical stack, wherein the maximum trace escape density equals the reciprocal of (Tw+Ts), and wherein Tw equals the width of the traces and Ts equals the spacing between the traces; and coupling lands on an integrated circuit (IC) to corresponding lands on the substrate surface.

13. The method recited in claim 12, wherein the IC is an unpackaged die.

14. The method recited in claim 12, wherein the IC is a packaged die.

15. The method recited in claim 12, wherein the lands are formed as a plurality of vertical stack patterns at the periphery of the surface of the substrate.

16. The method recited in claim 15, wherein the plurality of vertical stack patterns each comprise at least three lands, and wherein the traces coupled to corresponding lands in each vertical stack are all located on the same side of the vertical stack.

17. An electronic package comprising:
an integrated circuit (IC) comprising a first plurality of lands on a surface thereof, including a first dense formation of lands;
a substrate comprising a second plurality of lands on a surface thereof, including a second dense formation of lands formed in an undulating pattern to maximize the density of the second dense formation of lands, while constrained by the size of the second dense formation of lands and by the width and spacing of substrate traces coupled to the second dense formation of lands; and
elements coupling the first plurality of lands to the second plurality of lands.

18. The electronic package recited in claim 17, wherein the maximum trace escape density equals the reciprocal of (Tw+Ts), and wherein Tw equals the width of the substrate traces and Ts equals the spacing between the substrate traces.

19. The electronic package recited in claim 17, wherein the second dense formation of lands is formed as a plurality of undulating rows at the periphery of the surface of the substrate.

20. The electronic package recited in claim 17, wherein the second dense formation of lands further comprises a face center rectangular pattern.

21. The electronic package recited in claim 17, wherein the IC is an unpackaged die.

22. The electronic package recited in claim 17, wherein the IC is a packaged die.

23. A data processing system comprising:
a bus coupling components in the data processing system;
a display coupled to the bus;
external memory coupled to the bus; and
a processor coupled to the bus and including at least one electronic package comprising:
an integrated circuit (IC) comprising a first plurality of lands on a surface thereof, including a first dense formation of lands;
a substrate comprising a second plurality of lands on a surface thereof, including a second dense formation of lands formed in an undulating pattern to maximize the density of the second dense formation of lands, while constrained by the size of the second dense formation of lands and by the width and spacing of substrate traces coupled to the lands; and
elements coupling the first plurality of lands to the second plurality of lands.

24. The data processing system recited in claim 23, wherein the second dense formation of lands is formed as a plurality of undulating rows at the periphery of the surface of the substrate.

25. The data processing system recited in claim 23, wherein the IC is an unpackaged die.

26. A substrate on which to mount an integrated circuit (IC) having a first dense formation of lands, the substrate comprising:
a second dense formation of lands on a surface thereof formed in a geometrical pattern to maximize the density of the second dense formation of lands, while constrained by the size of individual lands and by the width and spacing of substrate traces coupled to the lands,
wherein the second dense formation of lands is formed in a pattern comprising a combination of a face center rectangular pattern and an undulating pattern.

27. The substrate recited in claim 26, wherein the maximum trace escape density equals the reciprocal of (Tw+Ts), and wherein Tw equals the width of the substrate traces and Ts equals the spacing between the substrate traces.

28. The substrate recited in claim 26, wherein the undulating pattern comprises a plurality of rows.

29. A substrate on which to mount an integrated circuit (IC) having a first dense formation of lands, the substrate comprising:
a second dense formation of lands on a surface thereof formed in a geometrical pattern to maximize the density of the second dense formation of lands, while constrained by the size of individual lands and by the width and spacing of substrate traces coupled to the lands,
wherein the second dense formation of lands is formed in a pattern comprising a combination of a face center rectangular pattern and a wave pattern.

30. The substrate recited in claim 29, wherein the maximum trace escape density equals the reciprocal of (Tw+Ts), and wherein Tw equals the width of the substrate traces and Ts equals the spacing between the substrate traces.

31. The substrate recited in claim 29, wherein the wave pattern comprises a plurality of rows.

32. A substrate on which to mount an integrated circuit (IC) having a first dense formation of lands, the substrate comprising:
a second dense formation of lands on a surface thereof formed in a geometrical pattern to maximize the density of the second dense formation of lands, while constrained by the size of individual lands and by the width and spacing of substrate traces coupled to the lands,
wherein the second dense formation of lands is formed in a pattern comprising a combination of a face center rectangular pattern and a zigzag pattern having a plurality of zigzag rows.

33. The substrate recited in claim 32, wherein the maximum trace escape density equals the reciprocal of (Tw+Ts), and wherein Tw equals the width of the substrate traces and Ts equals the spacing between the substrate traces.

34. The substrate recited in claim 32, wherein the plurality of zigzag rows are substantially parallel.

* * * * *